(12) United States Patent
McCown

(10) Patent No.: US 7,200,544 B1
(45) Date of Patent: Apr. 3, 2007

(54) SYSTEMS FOR SELECTIVELY DISABLING TIMING VIOLATIONS IN HARDWARE DESCRIPTION LANGUAGE MODELS OF INTEGRATED CIRCUITS AND METHODS OF OPERATING THE SAME

(75) Inventor: Hal C. McCown, Ft. Worth, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 796 days.

(21) Appl. No.: 10/032,208

(22) Filed: Oct. 26, 2001

(51) Int. Cl.
  *G06F 17/50* (2006.01)
  *G06F 9/45* (2006.01)
  *G06F 9/455* (2006.01)
(52) U.S. Cl. .............. 703/19; 716/1; 716/4; 716/5; 716/6; 716/18; 703/14
(58) Field of Classification Search ............ 716/4, 716/6, 18; 703/19, 14
See application file for complete search history.

(56) References Cited

U.S. PATENT DOCUMENTS 5,696,771 A * 12/1997 Beausang et al. ........... 714/726
5,841,663 A * 11/1998 Sharma et al. ............... 716/18
5,907,695 A *  5/1999 Dearth ........................ 703/17

* cited by examiner

*Primary Examiner*—Paul Rodriguez
*Assistant Examiner*—Tom Stevens

(57) ABSTRACT

There is disclosed an IC simulation system operable to (i) store a plurality of HDL modules, each of which is representative of a circuit element, (ii) receive a HDL description of a desired circuit, and (iii) synthesize a circuit netlist as a function of the received HDL circuit description and ones of the plurality of HDL modules, the circuit netlist is responsible for defining behavioral relationships among associated ones of the HDL modules, and associate a timing-violation controller with the circuit netlist to ignore selected timing violations sensed as a function of various ones of the behavioral relationships during simulation of the desired circuit.

20 Claims, 2 Drawing Sheets

SYSTEMS FOR SELECTIVELY DISABLING TIMING VIOLATIONS IN HARDWARE DESCRIPTION LANGUAGE MODELS OF INTEGRATED CIRCUITS AND METHODS OF OPERATING THE SAME

A portion of the disclosure of this patent document contains material which is subject to copyright protection. The copyright owner has no objection to the facsimile reproduction by anyone of this patent document or the patent disclosure, as it appears in the Patent and Trademark Office patent file or records, but otherwise reserves all copyright rights whatsoever.

TECHNICAL FIELD OF THE INVENTION

The present invention relates generally to integrated circuit design, and more specifically to systems for selectively disabling timing violations in hardware description language integrated circuit models and methods of operating the same, particularly such systems and methods that utilize pre-designed circuit modules.

BACKGROUND OF THE INVENTION

Innovation in silicon process technology continues to improve the performance and functionality of integrated circuits ("ICs") at decreasing production costs. These improvements proliferate the electronics and information processing industries, which exact increased demands upon the IC design industry for even faster and cheaper devices.

Over the past two decades, the IC design industry has become increasingly reliant upon a variety of computer-aided design ("CAD") tools. One such category of CAD tools is IC simulators which operate to define and represent ICs as a list of statements in a Hardware Description Language ("HDL"), such as Verilog, VHDL, or the like.

Such HDL simulators enable IC designers to enter behavior-like descriptions of logic circuit elements, or modules, and, more broadly, to describe the behavior of ICs in a variety of forms, including logic equations, truth tables, state diagrams, and the like. These simulators operate to compile associated circuit element descriptions into IC designs for simulation, modification and subsequent implementation.

Arguably, one of the most widely used HDL simulators is Verilog, which is operable to both design and document electronic systems. Verilog (i.e., Verify Logic) originated in the mid-1980s at Automated Integrated Design Systems, Inc. (later known as Gateway Design Automation, Inc.). Verilog was designed by Philip Moorby, who later became the Chief Designer for Verilog-XL and the first "Corporate Fellow" at Cadence Design Systems, Inc. Gateway Design Automation grew rapidly with the success of Verilog-XL and was acquired by Cadence Design Systems in 1989.

Verilog was invented as a simulation language, and its use for synthesis was an afterthought.

In the late-1980s, most designers were moving away from proprietary languages, like Verilog, and towards the United States Department of Defense HDL standard, known as Very High Speed Integrated Circuit ("VHSIC") HDL. In 1990, undebatably due to market pressure, Cadence Design Systems announced its decision to open the Verilog language to the public, thereby creating Open Verilog International ("OVI"). When OVI was formed, a number of small companies began working on Verilog-based simulators, including Chronologic Simulation, Inc., Frontline Design Automation, Inc. and others. The first of these simulators became available in 1992, though now there are many Verilog simulators available from a plethora of sources.

The Verilog simulation market grew substantially during the 1990s (e.g., estimations are that sales of Verilog-related tools accounted for more than $75,000,000 in 1994 and over $150,000,000 in 1998), making Verilog the most commercially significant HDL on the market. An IEEE work group was established in 1993 under a design automation subcommittee to produce the IEEE Verilog standard.

In 1995, Verilog became IEEE Standard 1364. The IEEE standardization process includes enhancements and refinements, and, to that end, work recently completed on the Verilog 1364-2000 standard.

In recent years, in response to continued demands from the IC design industry, simulation system design has been moving toward block-based design, in which a desired IC system is designed and simulated by integrating a plurality of existing component design blocks or modules. These pre-designed blocks/modules are commonly generated by internal design teams, licensed from other design companies, or the like, and may be supported by fundamentally different design structures and environments.

In this manner, the circuit designer accepts a system specification as input and ultimately provides a netlist-level design for physical implementation (including design place, route, and verification). If design specifications are within the capabilities of the intended or available processing technology, including clocking, power, and size specifications, the available design methodology is reasonably predictable and works well with available circuit design tools.

Available methodologies allow for, or enable, the use and re-use of pre-designed circuit blocks/modules from multiple sources in a circuit design. This affords tremendous flexibility to the circuit designer. A shortcoming however arises when timing violations occur among circuit modules during simulation and the HDL system generates notifier signals in response to timing check commands. These timing check commands inhibit and may even preclude continued testing of those circuit modules associated with the timing violation, as well as related circuit modules.

There exists a need in the art for a system that selectively disables timing-violation notifications in HDL IC models, as well as methods of operating the same. There exists a further need in the art for a system and a related method that selectively modifies behavior of notifier signals in response to such timing-violation notifications.

SUMMARY OF THE INVENTION

To address the above-discussed deficiencies of the prior art, it is a primary object of the present invention to provide systems for selectively disabling timing-violation notifications in hardware description language ("HDL") integrated circuit ("IC") models, as well as methods of operating the same. The principles of the present invention are particularly well suited with respect to systems and methods that utilize pre-designed circuit modules or blocks, though this is not a limitation.

In the attainment of the above-identified primary object, the present invention introduces a system for simulating IC designs whereby a HDL description of a desired IC may repeatedly be simulated and revised until the circuit designer is satisfied that the desired IC will work correctly. According to an advantageous embodiment thereof, the IC simulation system is operable to (i) store a plurality of HDL modules, each of which is representative of a circuit element, (ii) receive a HDL description of a desired circuit, and (iii)

synthesize a circuit netlist as a function of the received HDL circuit description and ones of the plurality of HDL modules, and associate a timing-violation controller with the circuit netlist.

The circuit netlist is responsible for defining behavioral relationships among associated ones of the HDL modules. These behavioral relationships will necessarily include timing/synchronization relationships among HDL modules, whether those modules are directly or indirectly associated.

The timing-violation controller is preferably under the control of the circuit designer and is operable, during simulation of the desired circuit, to ignore selected timing violations sensed as a function of various ones of the behavioral relationships, particularly the timing/synchronization relationships among HDL modules.

In a related embodiment, the timing-violation controller operates to not ignore (or be de-selected) one or more of the selected timing violations sensed during simulation of the circuit as a function of ones of the defined behavioral relationships. According to a further advantageous embodiment, each one of HDL modules is parameterized and specifies a logical operation. The IC simulation system is then operable to selectively match, with directed acyclic graphs ("DAGs"), a logical operation of the HDL description with a parameterized HDL module that is capable of performing the logical operation.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the terms "controller" and "processor" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
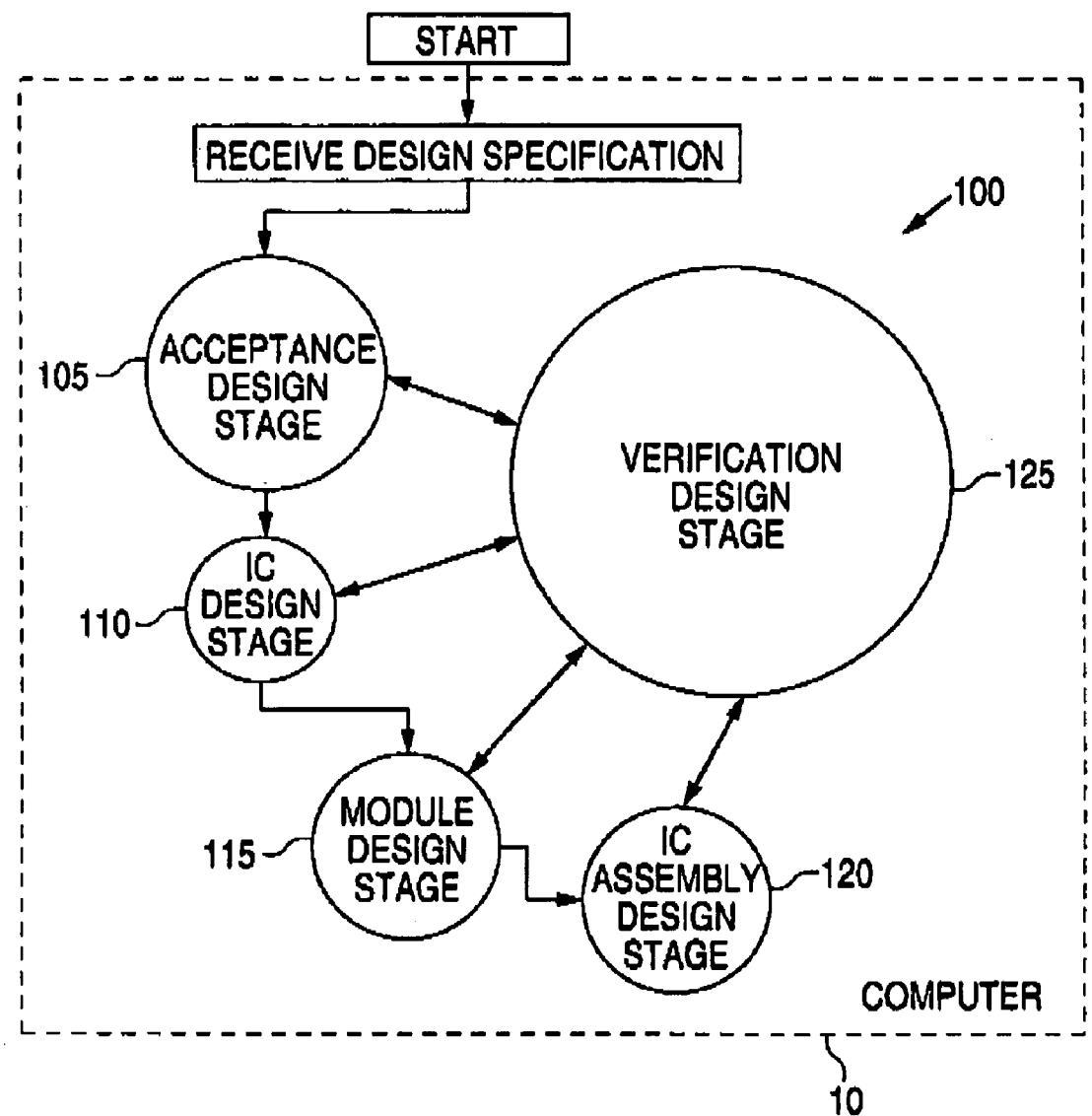
FIG. 1 illustrates a flowchart of an exemplary integrated circuit design process using hardware description language modules in accordance with one embodiment of the present invention.
Figure 2:
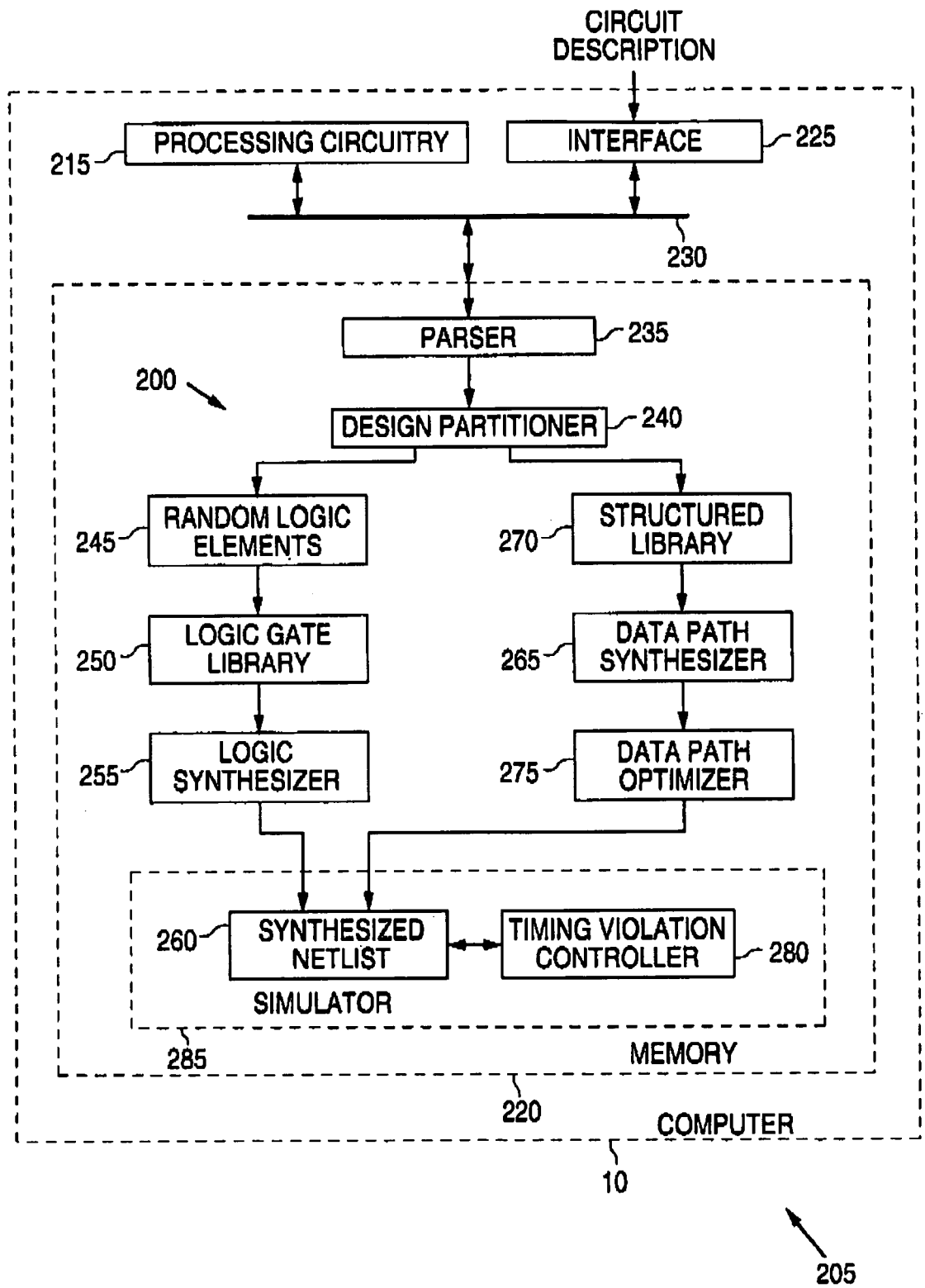
FIG. 2 illustrates a flowchart of an exemplary method of operating an integrated circuit simulation system using hardware description language modules in accordance with one embodiment of the present invention to ignore selected timing violations sensed during simulation of the desired circuit.

FIGS. 1 and 2, discussed below, and the various embodiments used to illustrate and describe the principles of the present invention in this patent document are by way of illustration only and should not be construed in any way to limit the scope of the invention.

Turning initially to FIG. 1, illustrated is a flowchart (generally designated 100) of an exemplary integrated circuit ("IC") design process using hardware description language ("HDL") modules with which the principles of the present invention may suitably be associated. Exemplary IC design process 100 illustratively includes an acceptance design stage 105, an IC-planning design stage 110, a module design stage 115, a IC-assembly design stage 120, and a verification design stage 125. Exemplary IC design process 100 illustratively executes on a computer 10, which includes a suitably arranged configuration of processing circuitry (e.g., central processing unit, etc.) and memory.

Exemplary acceptance design stage 105 enables an IC designer to evaluate prospective design project feasibility. The IC designer, for instance, receives a circuit specification which may include functional as well as other circuit requirements (e.g., budget, schedule, etc.). The IC designer may design circuit modules or use pre-designed circuit modules (e.g., legacy circuit modules, third-party designed circuit modules, etc.) to meet the needs of the circuit specification.

Exemplary IC-planning design stage 110 receives as input the design specification from acceptance design stage 105. IC-planning design stage 110 may illustratively be operable to: (i) develop chip design, assembly, implementation and other like plans focused on predictability of delays, routability, area, power dissipation, timing, and the like, and (ii) identify and adjust constraints. In short, IC-planning design stage 110 provides circuit planning within the bounds dictated at acceptance design stage 105. This may suitably be accomplished by forming budgets for selected circuit modules from acceptance design stage 105, revising specifications for pre-existing circuit modules, selecting specifications for pre-existing circuit modules, designing specifications for new circuit modules, and adjusting constraints within the processing method. IC-planning design stage 110 may also be operable to generate specifications for glue logic required to associate interconnected circuit modules.

Exemplary module design stage 115 is operable to associate an interface with the selected circuit modules, as necessary to interconnect the same in accord with IC-planning design stage 110. In short, module design stage 115 may illustratively be operable to: (i) ensure that all circuit modules meet specified constraints and budget, and design plans and architectures, (ii) provides models and views of all circuit modules to IC-assembly design stage 120, and (iii) enables design for authoring the new circuit modules generated in the IC-planning design stage 110, adapting legacy circuit modules, and adapting third-party circuit modules.

Exemplary IC-assembly design stage 120 is operable to associate circuit modules to tape-out the top-level design for design stage fabrication. IC-assembly design stage 120 provides final placement of hard blocks and chip bus routing, as well as the completion of any global design details.

Exemplary verification design stage 125 is operable to ensure proper operation of each of design stages 105–120, illustratively providing functional, timing and physical verification.

Verification design stage 125 ensures that logic functions and chip test benches for the selected circuit modules at each stage of the design meet functional requirements of the specification. Functional verification may suitably be performed during acceptance design stage 105, IC-planning design stage 110, module design stage 115, or IC-assembly design stage 125.

Verification design stage 125 also ensures that signal timing at each stage of the design is appropriate to generate the logic functions and pass the tests specified in the specification. Timing verification can be performed during acceptance design stage 105, IC-planning design stage 110, module design stage 115, or IC-assembly design stage 125.

According to the present embodiment, the circuit designer is able to selectively disable timing-violation notifications in HDL IC models. IC design process 100 simulates IC designs (described with references to FIG. 2) whereby a HDL description of a desired IC may repeatedly be simulated and revised until the circuit designer is satisfied that the desired IC will work correctly.

IC design process 100 is operable to (i) store a plurality of HDL modules, each of which is representative of a circuit element, (ii) receive a HDL description of a desired circuit, and (iii) synthesize a circuit netlist as a function of the received HDL circuit description and ones of the plurality of HDL modules, and associate a timing-violation controller with the circuit netlist. The circuit netlist is responsible for defining behavioral relationships among associated ones of the HDL modules, which necessarily include timing/synchronization relationships among HDL modules. The timing-violation controller is preferably under the control of the circuit designer and is operable, during simulation of the desired circuit, to ignore selected timing violations sensed as a function of various ones of the behavioral relationships, especially timing/synchronization relationships among HDL modules.

Verification design stage 125 also ensures that the physical layout for the circuit design meets the specification.

If any errors occur during verification of any of design stages 105–115, these errors are preferably corrected before going to a subsequent stage. At IC-assembly design stage 120, the design process generates a top-level design for fabricating the desired circuit, as well as verifies test branches for each of the circuit blocks used in the design and the circuit as a whole.

Turning next to FIG. 2, illustrated is a flowchart (generally designated 200) of an exemplary method of operating an IC-simulation system 205 using HDL modules in accordance with one embodiment of the present invention to ignore selected timing violations sensed during simulation of the desired circuit. Exemplary IC design process 200 illustratively executes on computer 10, which includes a suitably arranged configuration of processing circuitry 215 (e.g., central processing unit, etc.), memory 220 and an interface 225. IC-design process 200 executing on processing circuitry 215 from memory 220 under control, in part, by a circuit designer via interface 225 cooperatively comprise exemplary IC-simulation system 205. Processing circuitry 215, memory 220 and interface 225 are illustratively associated via internal bus 230.

Exemplary interface 225 is operable to receive a HDL description of a circuit to convey a synthesized netlist to a circuit designer, as well as to enable the circuit designer to simulate operation of the same while interacting with timing-violation controls in accord with the principles of the present invention. Interface 225 may suitably include a keyboard, monitor, or any other suitable combination of computer peripheral devices and a graphical user interface ("GUI").

Exemplary processing circuitry 215 operates in conjunction with data and instructions stored in memory 220, which may be any combination of random-access memory ("RAM"), read-only memory ("ROM"), or other suitable storage device. Exemplary memory 220 illustratively includes a parser 235, design partitioner 240, random logic elements 245, a logic gate library 250, logic synthesizer 255, synthesized netlist 260, data path synthesizer 265, structured library 270, data path optimizer 275, and a timing-violation controller 280.

Exemplary parser 235 is operable to translate the HDL description of the circuit to be simulated that is received from the circuit designer via interface 225. According to the illustrated embodiment, the HDL description of the circuit may suitably be translated into an expression tree conventionally commonly referred to as a Directed Acyclic Graph ("DAG"; DAGs may be directly derived from the HDL description of circuit elements, or, as in alternate implementations, may be derived first into an intermediate Register Transfer Level ("RTL") structure corresponding to the circuit elements and then into DAGs; further discussion of the same is beyond the scope of this patent document as it is well known by those of skill in the art).

Once parsing is completed, exemplary design partitioner 240 is operable, given a HDL description translated (or converted) to DAGs, to partition data paths. According to the illustrated embodiment, data paths are partitioned into circuit element logic and partitioned based on data path signal width (e.g., expressions with the same signal width may suitably be associated into a single data path, partitioning larger data paths into smaller data paths based on expression width).

Design partitioner 240 is further operable to partition those circuit elements that must be implemented using random logic from data path elements, resulting in a listing of boolean expressions representing exemplary random logic elements 245, each of which is mapped to one or more circuit elements in exemplary logic gate library 250.

Exemplary logic synthesizer 255 is operable to map random logic elements 245 into logic gates generating the logic gate portion of synthesized netlist 260 for the specified HDL circuit description.

Exemplary data path synthesizer 265 is operable to use structured library 270 to generate a data path structure (or portion) of synthesized netlist 260. Exemplary structured library 270 is generated respectively using parser 235 and design partitioner 240 to parse and graph the HDL description for all circuit elements.

Exemplary data path optimizer 275 is operable to further process the data path structure to generate an optimized set of library modules representing the specified circuit elements and to generate module interconnections to produce synthesized net list 260, stated differently, the various data path components are connected to form the synthesized netlist.

In summary, netlists generated from parameterized HDL modules are combined with netlists created from non-parameterized HDL modules to form synthesized netlist 260. Synthesized netlist 260 defines behavioral relationships among associated ones of the HDL modules. These behavioral relationships will necessarily include timing/synchronization relationships among the same, whether those HDL modules are directly or indirectly associated.

Exemplary simulator 285 associates timing-violation controller 280 with synthesized circuit netlist 260. Exemplary timing-controller 280 is operable to selectively disable timing-violation notifications in HDL IC models in accord with one embodiment of the present invention. According to one embodiment, this is accomplished by suitably modifying circuit netlist 260 to allow for selective disablement by the circuit designer.

Once circuit netlist 260 is capable of selective disablement, simulator 285 enables the circuit designer to repeatedly simulate the function/operation of the desired IC using synthesized circuit netlist 260 and revise the same in response thereto until the desired IC works correctly. According to this embodiment, timing-violation controller 280 is preferably under the control of the circuit designer and is operable to ignore selected timing violations sensed as a function of various ones of the behavioral relationships, particularly timing/synchronization relationships among HDL modules.

An exemplary HDL implementation of a timing-violation controller in accord with the principles of the present invention is set for in Appendix "A", which illustrates a module-notifier-disable routine, and Appendix "B", which illustrates a module-notifier-test bench routine, both in accord with the principles of the present invention. It should be noted that these exemplary implementations are introduced for illustrative purposes only and the specific specifications should not be construed as limitations unless specifically delineated as such in this patent document.

Although the present invention has been described in detail, those skilled in the art should understand that they can make various changes, substitutions and alterations herein without departing from the spirit and scope of the invention in its broadest form.

APPENDIX "A"

```
module notifier_disable;
    initial begin
        'ifdef dis_clr_rem
            force notifier_test.flop1.notifier_clr_rem = 1'bx;
        'endif
        'ifdef dis_clr_rec
            force notifier_test.flop1.notifier_clr_rec = 1'bx;
        'endif
        'ifdef dis_pos_sh
            force notifier_test.flop1.notifier_pos_sh = 1'bx;
        'endif
        'ifdef dis_neg_sh
            force notifier_test.flop1.notifier_neg_sh = 1'bx;
        'endif
```

APPENDIX "A"-continued

```
        'ifdef dis_cp_low
            force notifier_test.flop1.notifier_cp_low = 1'bx;
        'endif
        'ifdef dis_clr_high
            force notifier_test.flop1.notifier_clr_high = 1'bx;
        'endif
        'ifdef dis_cp_high
            force notifier_test.flop1.notifier_cp_high = 1'bx;
        'endif
    end
endmodule
```

APPENDIX "B"

```
'timescale 1ps/1ps
module notifier_test;
reg CLR;
reg CP;
reg D;
integer i;
DFF_QZ_CLR_X2_LD50         flop1 (
                            .QZ(QZ),
                            .CLR(CLR), .CP(CP), .D(D)
                           );
initial begin
    for (i = 0; i <= 2; i = i + 1) begin
        #1000           CLR = 1'b1;
        #1000           D = 1'b1;
                        CP = 1'b0;
        #5000           CLR = 1'b0;
//      Invalid CP high pulse width - notifier7
        #1000           CP = 1'b1;
        #1000           CP = 1'b0;
//      Valid CP Pulse width
        #5000           CP = 1'b1;
        #5000           CP = 1'b0;
//      Invalid CLR high pulse width - notifier6
        #5000           CLR = 1'b1;
        #1000           CLR = 1'b0;
//      Invalid CLR deassertion to CP - notifier2
        #5000           CLR = 1'b1;
        #5000           CLR = 1'b0;
        #300            CP = 1'b1;
//      Valid CLR assertion
        #5000           CP = 1'b0;
        #5000           CLR = 1'b1;
//      Invalid CP to deassertion of CLR - notifier1
        #5000           CP = 1'b1;
        #300            CLR = 1'b0;
//      Valid CLR assertion
        #5000           CLR = 1'b1;
//      Invalid CP low pulse width - notifier5
        #5000           CLR = 1'b0;
        #5000           CP = 1'b0;
        #2000           CP = 1'b1;
//      Valid CP pulse width
        #5000           CP = 1'b0;
        #5000           CP = 1'b1;
//      Invalid setup/hold time negedge D to CP - notifier3
        #5000           CP = 1'b0;
        #5000           D = 1'b0;
        #1000           CP = 1'b1;
//      Valid setup/hold time D to CP
        #5000           CP = 1'b0;
        #5000           CP = 1'b1;
//      Invalid setup/hold time posedge D to CP - notifier2
        #5000           CP = 1'b0;
        #5000           D = 1'b1;
        #1000           CP = 1'b1;
'ifdef add_simul
//      Valid setup/hold time D to CP
        #5000           CP = 1'b0;
        #5000           CP = 1'b1;
```

APPENDIX "B"-continued

```
//      Invalid CP low time and D setup time
        #5000               CP = 1'b0;
        #3000               D = 1'b0;
        #100                CP = 1'b1;
    'endif
        #10000;
        end        // for
    end // initial
initial begin
    $recordfile("notifier_test.trn");
    $recordvars("depth=0");
    end
    endmodule
```

What is claimed is:

1. An integrated circuit ("IC") simulation system operable to (i) store a plurality of Hardware Description Language ("HDL") modules, each one of said plurality of HDL modules representative of a circuit element, (ii) receive a HDL description of a circuit to be simulated, and (iii) synthesize a circuit netlist as a function of said received HDL circuit description and ones of said plurality of HDL modules, said circuit netlist defining behavioral relationships among associated ones of said ones of said plurality of HDL modules, and associate a timing-violation controller with said circuit netlist, said timing-violation controller to ignore selected timing violations sensed during simulation of said circuit as a function of ones of said defined behavioral relationships.

2. The IC simulation system as set forth in claim 1 comprising a processor and associated memory.

3. The IC simulation system as set forth in claim 2 wherein said associated memory is operable to store an IC-design process program and wherein said processor is operable to execute said IC-design process program.

4. The IC simulation system as set forth in claim 2 wherein said associated memory is operable to store said circuit netlist as a data structure.

5. The IC simulation system as set forth in claim 1 wherein said each one of said plurality of HDL modules is parameterized and specifies a logical operation.

6. The IC simulation system as set forth in claim 5 further operable to selectively match, with directed acyclic graphs ("DAGs"), a logical operation of said HDL description with a parameterized HDL module that is capable of performing said logical operation.

7. The IC simulation system as set forth in claim 1 wherein said timing-violation controller operates to not ignore ones of said selected timing violations sensed during simulation of said circuit as a function of ones of said defined behavioral relationships.

8. A method of operating an integrated circuit ("IC") simulation system comprising the steps of:
storing a plurality of Hardware Description Language ("HDL") modules in memory, each one of said plurality of HDL modules representative of a circuit element;
receiving a HDL description of a circuit to be simulated;
synthesizing a circuit netlist as a function of said received HDL circuit description and ones of said plurality of HDL modules, said circuit netlist defining behavioral relationships among associated ones of said ones of said plurality of HDL modules; and
associating a timing-violation controller with said circuit netlist, said timing-violation controller to ignore selected timing violations sensed during simulation of said circuit as a function of ones of said defined behavioral relationships.

9. The method of operating said IC simulation system as set forth in claim 8 comprising the step of said IC simulation system operating a processor that is associated with said memory.

10. The method of operating said IC simulation system as set forth in claim 9 further comprising the steps of:
storing an IC-design process program; and
executing said IC-design process program with said processor.

11. The method of operating said IC simulation system as set forth in claim 9 further comprising the step of storing said circuit netlist as a data structure.

12. The method of operating said IC simulation system as set forth in claim 8 wherein said each one of said plurality of HDL modules is parameterized and specifies a logical operation.

13. The method of operating said IC simulation system as set forth in claim 12 further comprising the step of selectively matching, with directed acyclic graphs ("DAGs"), a logical operation of said HDL description with a parameterized HDL module that is capable of performing said logical operation.

14. The method of operating said IC simulation system as set forth in claim 8 further comprising the step of operating said timing-violation controller to not ignore ones of said selected timing violations sensed during simulation of said circuit.

15. A computer readable medium with instructions that direct a computer to operate as an integrated circuit ("IC") simulation system, comprising:
a plurality of Hardware Description Language ("HDL") modules stored in said computer readable medium, each one of said plurality of HDL modules representative of a circuit element;
a HDL description of a circuit to be simulated stored in said computer readable medium;
executable instructions stored in said computer readable medium to synthesize a circuit netlist as a function of said HDL circuit description and ones of said plurality of HDL modules, said circuit netlist defining behavioral relationships among associated ones of said ones of said plurality of HDL modules; and
executable instructions stored in said computer readable medium to associate a timing-violation controller with said circuit netlist, said timing-violation controller to ignore selected timing violations sensed during simulation of said circuit as a function of ones of said defined behavioral relationships.

16. The computer readable medium as set forth in claim 15 further comprising an IC-design process program stored in said computer readable medium.

17. The computer readable medium as set forth in claim 15 wherein said circuit netlist is stored in said computer readable medium as a data structure.

18. The computer readable medium as set forth in claim 15 wherein said each one of said plurality of HDL modules is parameterized and specifies a logical operation.

19. The computer readable medium as set forth in claim 18 further comprising executable instructions stored in said computer readable medium to selectively match, with directed acyclic graphs ("DAGs"), a logical operation of said HDL description with a parameterized HDL module that is capable of performing said logical operation.

20. The computer readable medium as set forth in claim 15 further comprising executable instructions stored in said computer readable medium to operate said timing-violation controller to not ignore ones of said selected timing violations sensed during simulation of said circuit.

* * * * *